(12) United States Patent
Tung et al.

(10) Patent No.: US 12,713,693 B2
(45) Date of Patent: Aug. 18, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Yu-Lung Tung, Hsinchu (TW); Xiaodong Wang, Hsinchu (TW); Jhon-Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 450 days.

(21) Appl. No.: 18/233,986

(22) Filed: Aug. 15, 2023

(65) Prior Publication Data

US 2025/0063810 A1 Feb. 20, 2025

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |

(52) U.S. Cl.

CPC ........... *H10D 84/85* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/0186* (2025.01); *H10D 84/0188* (2025.01); *H10D 84/038* (2025.01)

(58) Field of Classification Search

CPC ...... H10D 84/85; H10D 30/014; H10D 30/43; H10D 30/6735; H10D 62/121; H10D 64/017; H10D 84/0167; H10D 84/0186; H10D 84/0188; H10D 84/038; H10D 84/851; H10D 84/0128; H10D 84/8311; H10D 30/6757; H10D 84/0151; H10D 84/832

See application file for complete search history.

(56) References Cited

U.S. PATENT DOCUMENTS

| | | | | |
|---|---|---|---|---|
| 11,515,399 | B2 * | 11/2022 | Dentoni Litta | H01L 21/76895 |
| 2024/0145540 | A1 * | 5/2024 | Ju | H10D 30/6735 |
| 2024/0213243 | A1 * | 6/2024 | Katakam | H01L 21/76895 |
| 2024/0213325 | A1 * | 6/2024 | Vega | H10D 84/85 |
| 2025/0331248 | A1 * | 10/2025 | Pan | H10D 62/822 |

* cited by examiner

*Primary Examiner* — Douglas W Owens

(74) *Attorney, Agent, or Firm* — Birch, Stewart, Kolasch & Birch, LLP

(57) ABSTRACT

A semiconductor structure includes a first active region, a second active region and a dielectric wall. The second active region is disposed adjacent to the first active region, wherein there is a space between the first active region and the second active region. The dielectric wall is formed within the space between the first active region and the second active region. The dielectric wall has a first wall width and a second wall width different from the first wall width.

20 Claims, 20 Drawing Sheets

110A
110A2
FS1
110B
110B2
FS2
Z
X
Y
150A
150B
160A
SP2
160B
130
140A
140B
110A2
FS11
FS12
FS1
110B2
FS21
FS22
FS2
105A
105B
105
120(122)
$W_{SP2}$ 110A
110A2
FS1
110B
110B2
FS2
Z
X
Y
150A
150B
160A
SP2
160B
140A
140B
110A2
FS11
FS12
FS1
110B2
FS21
FS22
FS2
105A
105B
105
220(222)
$W_{SP2}$

SEMICONDUCTOR STRUCTURE AND MANUFACTURING METHOD THEREOF

BACKGROUND

A semiconductor structure includes a plurality of transistors and a BEOL structure. The BEOL structure includes a conductive via which is electrically connected to an epitaxy (source or drain) of the transistor. An electrical conduction path of the conductive via to the epitaxy decides the electrical conduction reaction speed of the transistor. Thus, how to propose an efficient electrical path is a goal of the industry in this technical field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A(b) illustrates a cross-sectional view of the structure in FIG. 4A(a) along a direction 4A(b)-4A(b)';

FIG. 4A(c) illustrates a cross-sectional view of the structure in FIG. 4A(a) along a direction 4A(c)-4A(c)';

FIG. 4B(b) illustrates a cross-sectional view of the structure in FIG. 4B(a) along a direction 4B(b)-4B(b)';

FIG. 4B(c) illustrates a cross-sectional view of the structure in FIG. 4B(a) along a direction 4B(c)-4B(c)';

FIG. 4C(b) illustrates a cross-sectional view of the structure in FIG. 4C(a) along a direction 4C(b)-4C(b)';

FIG. 4C(c) illustrates a cross-sectional view of the structure in FIG. 4C(a) along a direction 4C(c)-4C(c)';

FIG. 4D(b) illustrates a cross-sectional view of the structure in FIG. 4D(a) along a direction 4D(b)-4D(b)';

FIG. 4D(c) illustrates a cross-sectional view of the structure in FIG. 4D(a) along a direction 4D(c)-4D(c)';

FIG. 4E(b) illustrates a cross-sectional view of the structure in FIG. 4E(a) along a direction 4E(b)-4E(b)';

FIG. 4E(c) illustrates a cross-sectional view of the structure in FIG. 4E(a) along a direction 4E(c)-4E(c)';

FIG. 4F(b) illustrates a cross-sectional view of the structure in FIG. 4F(a) along a direction 4F(b)-4F(b)';

FIG. 4F(c) illustrates cross-sectional view of the structure in FIG. 4F(a) along a direction 4F(c)-4F(c)';

FIG. 4G(b) illustrates a cross-sectional view of the structure in FIG. 4G(a) along a direction 4G(b)-4G(b)'; and FIG. 4G(c) illustrates a cross-sectional view of the structure in FIG. 4G(a) along a direction 4G(c)-4G(c)'.

DETAILED DESCRIPTION

Figure 1A:
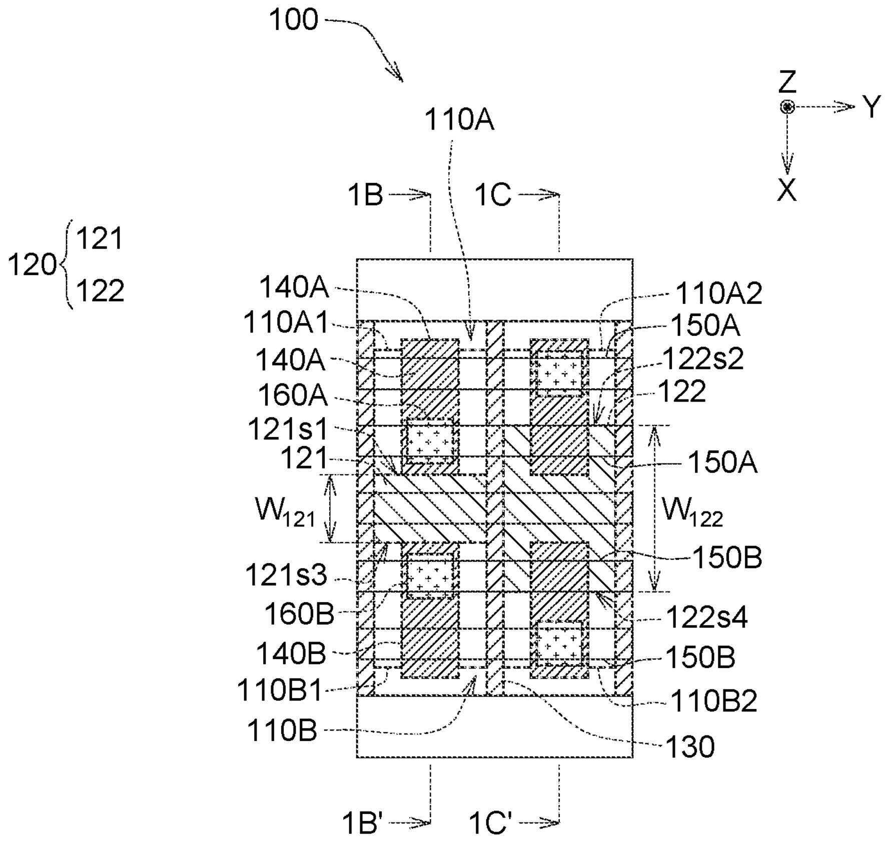
FIG. 1A illustrates a schematic diagram of a semiconductor structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for case of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figures 1B, 1C:
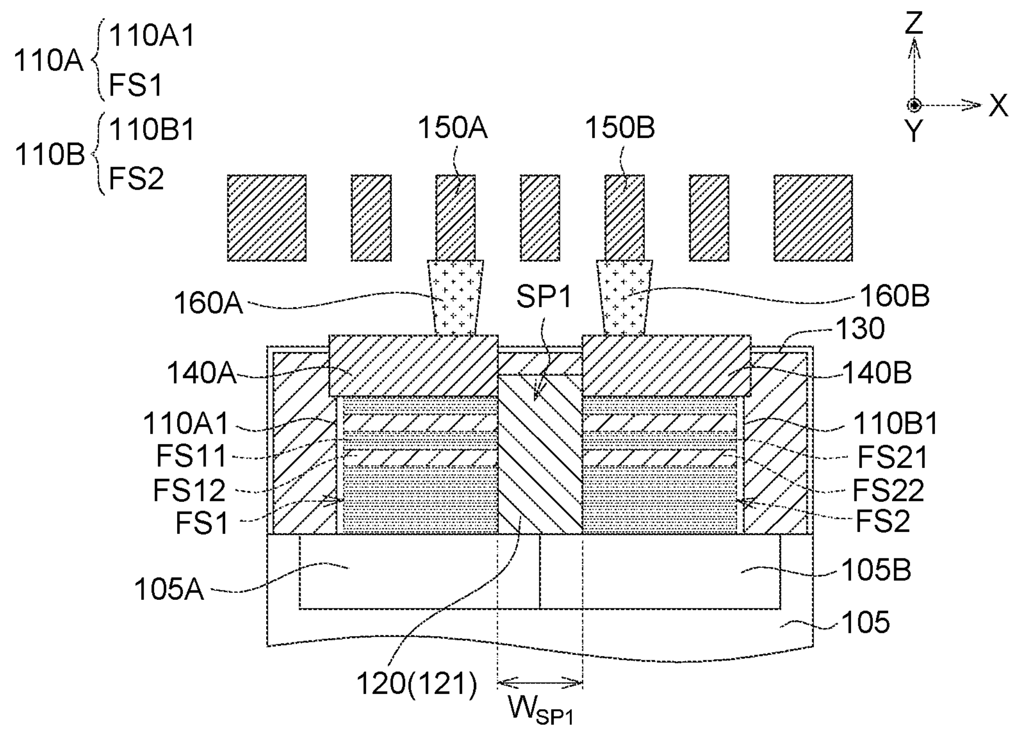
FIG. 1B illustrates cross-sectional view of the semiconductor structure in FIG. 1A along a direction 1B-1B'.
FIG. 1C illustrates cross-sectional view of the semiconductor structure 100 in FIG. 1A along a direction 1C-1C'.

Referring to FIGS. 1A to 1C, FIG. 1A illustrates a schematic diagram of a semiconductor structure 100 according to an embodiment of the present disclosure, FIG. 1B illustrates cross-sectional view of the semiconductor structure 100 in FIG. 1A along a direction 1B-1B', and FIG. 1C illustrates cross-sectional view of the semiconductor structure 100 in FIG. 1A along a direction 1C-1C'.

The semiconductor structure 100 includes, for example, at least one Gate-all-around (GAA) structure, at least one fork-sheet structure, etc.

As illustrated in FIGS. 1A to 1C, the semiconductor structure 100 includes a substrate 105, a plurality of active regions (includes at least one first active region 110A and at least one second active region 110B), at least one dielectric wall 120, at least one metal gate 130, a conductive contact layer (includes at least one first conductive contact 140A and at least one second conductive contact 140B), a conductive line layer (includes at least one first conductive line 150A and at least one second conductive line 150B) and a conductive via layer (includes at least one first conductive via 160A and at least one second conductive via 160B). Although not illustrated, the semiconductor structure 100 further includes a dielectric layer or an oxide layer covering the conductive line layer and the conductive via layer.

As illustrated in FIGS. 1A to 1C, the second active region 110B is disposed adjacent to the first active region 110A, wherein there is a space SP between the first active region 110A and the second active region 110B. The dielectric wall 120 is formed within the space SP between the first active region 110A and the second active region 110B. The dielectric wall 120 has a first wall width $W_{121}$ and a second wall width $W_{122}$ different from the first wall width $W_{121}$. Through different width design, the configuration flexibility and/or the design flexibility of the active region could be increased, and accordingly it could improve the electrical connection between the active region and the conductive via.

In an embodiment, the first wall width $W_{121}$ may ranges 1 nanometer (nm) and 50 nm, even greater or less, and the second wall width $W_{122}$ may ranges 1 nm and 100 nm, even greater or less. In another embodiment, a ratio of the second wall width $W_{122}$ to the first wall width $W_{121}$ may range 1.1 and 2, even greater or less.

The substrate 105 may be formed of silicon. Furthermore, the substrate 105 may be, for example, a silicon wafer.

As illustrated in FIGS. 1A to 1C, the semiconductor structure 100 further includes at least one first-type doped region 105A and at least one second-type doped region 105B doped in the substrate 105. In an embodiment, the first-type doped region 105A is one of an N-type semiconductor doped region and a P-type semiconductor doped region, while the second-type doped region 105B is the other of the N-type semiconductor doped region and the P-type semiconductor doped region.

As illustrated in FIGS. 1A to 1C, the first active region 110A is formed over/on the first-type doped region 105A, and the second active region 110B is formed over/on the second-type doped region 105B.

As illustrated in FIGS. 1A to 1C, the first active region 110A includes a first epitaxy 110A1, a second epitaxy 110A2 and at least one first fin structure FS1 (the region which is covered by the metal gate 130). The first fin structure FS1 extends in Y axis. In the present embodiment, the first epitaxy 110A1 is corresponding to or overlaps the first wall width $W_{121}$ in X axis, and the second epitaxy 110A2 is corresponding to or overlaps the second wall width $W_{122}$ in X axis. The first fin structure FS1 includes a plurality of first sheets (or first active channel layers) FS11 and a plurality of first spacers FS12, wherein one of the first sheets FS11 is formed between adjacent two of the first spacers FS12. The first epitaxy 110A1 is one of a source epitaxy and a drain epitaxy, and the second epitaxy 110A2 is one of a source epitaxy and a drain epitaxy. Although not illustrated, each first spacer FS12 may include a metal material (for example, a portion of the metal gate 130) and an inner spacer formed on a lateral surface of the metal material.

As illustrated in FIGS. 1A to 1C, the second active region 110B includes a third epitaxy 110B1, a fourth epitaxy 110B2 and at least one second fin structure FS2 (the region which is covered by the metal gate 130). The second fin structure FS2 extends in Y axis. In the present embodiment, the third epitaxy 110B1 is corresponding to or overlaps the first wall width $W_{121}$ in X axis, and the fourth epitaxies 110B2 is corresponding to or overlaps the second wall width $W_{122}$ in X axis. The second fin structure FS2 includes a plurality of second sheets (or second active channel layers) FS21 and a plurality of second spacers FS22, wherein one of the second sheets FS21 is formed between adjacent two of the second spacers FS22. The third epitaxy 110B1 is one of the source epitaxy and the drain epitaxy, and the fourth epitaxy 110B2 is one of the source epitaxy and the drain epitaxy. Although not illustrated, each second spacer FS22 may include a metal material (a portion of the metal gate 130) and an inner spacer formed on a lateral surface of the metal material.

In an embodiment, the source epitaxy, the drain epitaxy and the metal gate 130 may form a transistor, for example, a P-MOS transistor or N-MOS transistor. As illustrate in FIG. 1A, the semiconductor structure 100 includes at least two transistors which are corresponding different wall widths.

As illustrated in FIG. 1A, by the design of the wider second wall width $W_{122}$, the second epitaxy 110A2 and the fourth epitaxy 110B2 are pushed or formed outward in X axis. As a result, the second epitaxy 110A2 may be corresponding to or overlaps the first conductive via 160A in Z axis, and the fourth epitaxy 110B2 may be corresponding to or overlaps the second conductive via 160B in Z axis. Due to an electrical conduction path of the first conductive via 160A to the third epitaxy 110B1 being single vertical path without lateral path (for example, in XY plane), the electrical conduction path is short and the reaction speed of the transistor of the semiconductor structure 100 may be increased. Also, due to an electrical conduction path of the second conductive via 160B to the fourth epitaxy 110B2 being single vertical path without lateral path (for example, in XY plane), the electrical conduction path is short and the reaction speed of the transistor of the semiconductor structure 100 may be increased.

As illustrated in FIGS. 1A to 1C, the space SP includes a first sub-space SP1 and a second sub-space SP2 connected with the first sub-space SP1. The first sub-space SP1 and the second sub-space SP2 are located at opposite two sides of the metal gate 130. The first sub-space SP1 has a first space width $W_{SP1}$, and the second sub-space SP2 has a second space width $W_{SP2}$ different from the first space width $W_{SP1}$. In the present embodiment, the second space width $W_{SP2}$ is greater than the first space width $W_{SP1}$. In another embodiment, the second space width $W_{SP2}$ may be smaller than the first space width W1.

As illustrated in FIG. 1A, the dielectric wall 120 extends in a first direction (for example, Y axis). The dielectric wall 120 includes a first wall portion 121 having the first wall width $W_{121}$ and a second wall portion 122 having the second wall width $W_{122}$, wherein the first wall portion 121 may be connected with the first wall portion 121 or disconnected from the first wall portion 121. The first wall portion 121 has a first lateral surface 121*s*1 and a third lateral surface 121*s*3 opposite to the first lateral surface 121*s*1, and the second wall portion 122 has a second lateral surface 122*s*2 and a fourth lateral surface 122*s*4 opposite to the second lateral surface 122*s*2. In an embodiment, the second wall portion 122 protrudes relative to the first lateral surface 121*s*1, and the third lateral surface 121*s*3. Furthermore, the second lateral surface 122*s*2 protrudes beyond the first lateral surface 121*s*1 of the first wall portion 121, and the fourth lateral surface 122*s*4 protrudes beyond the third lateral surface 121*s*3 of the first wall portion 121.

Although not illustrated, the dielectric wall 120 may include a shell layer and a core layer, wherein the shell layer is formed on sidewalls of the space SP, and the core layer is formed on sidewalls of the shell layer and fills up the remaining space SP. The shell layer has a thickness ranging, for example, between 2 nm to 6 nm. The shell layer may be formed of a material including, for example, SiOC and/or SiOCN, while the core layer may be formed of a material including, for example, SiN and/or SiCN. In another embodiment, the shell layer may be formed of a material including, for example, SiN and/or SiCN, while the core layer may be formed of a material including, for example, SiOC and/or SiOCN.

As illustrated in FIGS. 1A to 1C, the metal gate 130 is formed over the first fin structure FS1 and the second fin structure FS2 in a second direction (for example, X axis). In an embodiment, a portion of the metal gate 130 may form the metal material of each first spacer FS12 of the first fin structure FS1 and the metal material of each second spacer FS22 of the second fin structure FS2.

As illustrated in FIGS. 1A to 1C, the first conductive contact 140A is formed over the first active region 110A, and the second conductive contact 140B is formed over the second active region 110B. Furthermore, the first conductive contacts 140A are connected with the first epitaxy 110A1 and the second epitaxy 110A2 of the first active region 110A, and the second conductive contacts 140B are connected with the third epitaxy 110B1 and the fourth epitaxy 110B2 of the second active region 110B. In addition, as illustrated in FIG. 1C, the first conductive contact 140A and/or the second conductive contact 140B may be formed over a portion of the dielectric wall 120, for example, the second wall portion 122 of the dielectric wall 120.

As illustrated in FIGS. 1B to 1C, the first conductive line 150A and the second conductive line 150B may be formed in a BEOL (Back End of Line) structure. For example, the first conductive line 150A and the second conductive line 150B are, for example, defined on M1 (Metal 1) of the BEOL structure. The portion below the conductive via layer or the conductive line layer may be defined as a FEOL (Front End of Line) structure.

As illustrated in FIGS. 1A to 1C, the first conductive via 160A is formed between the first conductive line 150A and the first conductive contact 140A. The first conductive via 160A extends between the first conductive line 150A and the first conductive contact 140A in a vertical direction (for example, Z axis). The second conductive via 160B is formed between the second conductive line 150B and the second conductive contact 140B. The second conductive via 160B extends between the second conductive line 150B and the second conductive contact 140B in the vertical direction. In addition, the conductive via herein may be formed of a material including, copper, tungsten, TiN, etc.

Figure 2A:
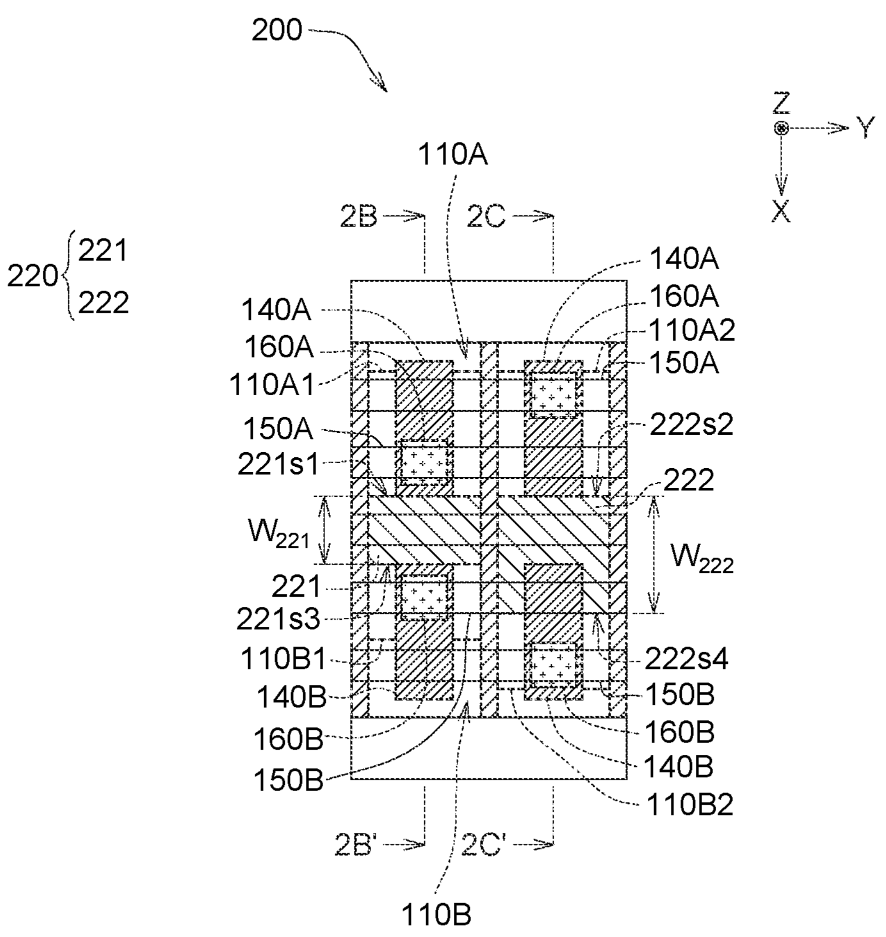
FIG. 2A illustrates a schematic diagram of a semiconductor structure according to an embodiment of the present disclosure.
Figures 2B, 2C:
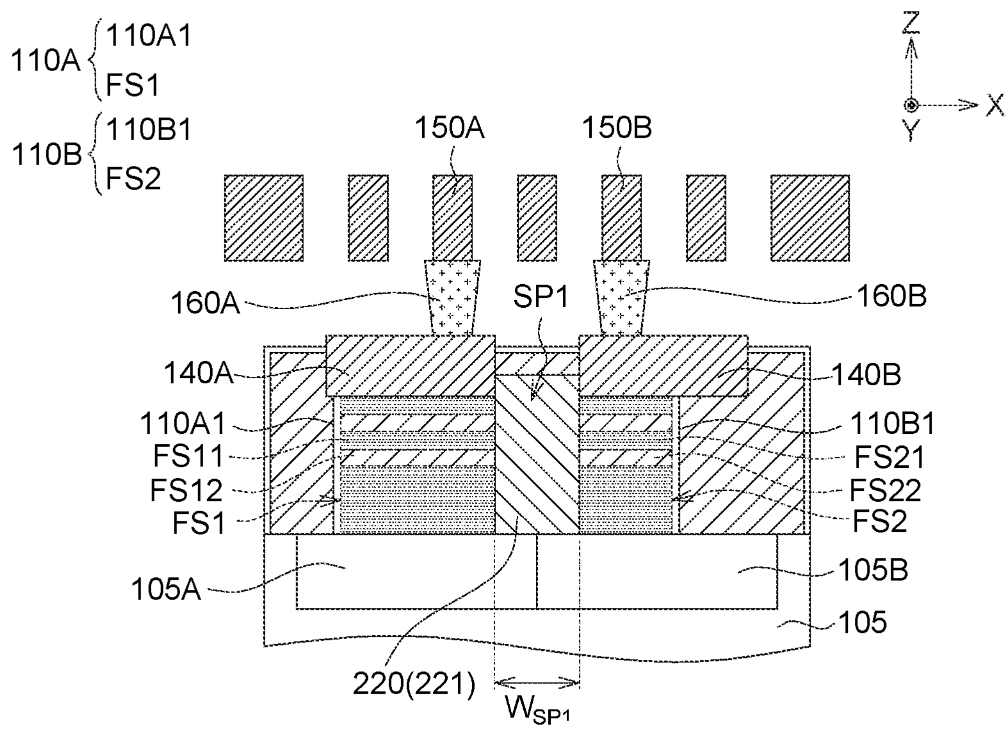
FIG. 2B illustrates cross-sectional view of the semiconductor structure in FIG. 2A along a direction 2B-2B'.
FIG. 2C illustrates cross-sectional view of the semiconductor structure in FIG. 2A along a direction 2C-2C'.

Referring to FIGS. 2A to 2C, FIG. 2A illustrates a schematic diagram of a semiconductor structure 200 according to an embodiment of the present disclosure, FIG. 2B illustrates cross-sectional view of the semiconductor structure 200 in FIG. 2A along a direction 2B-2B', and FIG. 2C illustrates cross-sectional view of the semiconductor structure 200 in FIG. 2A along a direction 2C-2C'.

The semiconductor structure 200 includes, for example, at least one Gate-all-around (GAA) structure, at least one fork-sheet structure, etc.

As illustrated in FIGS. 2A to 2C, the semiconductor structure 200 includes the substrate 105, a plurality of active regions (includes at least one first active region 110A and at least one second active region 110B), at least one dielectric wall 220, at least one metal gate 130, a conductive contact layer (includes at least one first conductive contact 140A and at least one second conductive contact 140B), a conductive line layer (includes at least one first conductive line 150A and at least one second conductive line 150B) and a conductive via layer (includes at least one first conductive via 160A and at least one second conductive via 160B).

As illustrated in FIGS. 2A to 2C, the second active region 110B is disposed adjacent to the first active region 110A, wherein there is the space SP between the first active region 110A and the second active region 110B. The dielectric wall 120 is formed within the space SP between the first active region 110A and the second active region 110B. The dielectric wall 220 has the first wall width $W_{121}$ and the second wall width $W_{122}$ different from the first wall width $W_{121}$. Through different width design, the configuration flexibility and/or the design flexibility of the active region could be increased, and accordingly it could improve the electrical connection between the active region and the conductive via.

The semiconductor structure 200 includes the features the same as or similar to that of the semiconductor structure 100, and the difference is that the dielectric wall 220 and the dielectric wall 120 are different in structure.

As illustrated in FIGS. 2A to 2C, the dielectric wall 220 includes a first wall portion 221 having the first wall width W1 and a second wall portion 222 having the second wall width W2, wherein the first wall portion 221 may be connected with the first wall portion 221 or disconnected from the first wall portion 221. The first wall portion 221 has a first lateral surface 221*s*1 and a third lateral surface 221*s*3 opposite to the first lateral surface 221*s*1, the second wall portion 222 has a second lateral surface 222*s*2 and a fourth lateral surface 2224 opposite to the second lateral surface 222*s*2. In the present embodiment, the second wall portion 222 protrudes relative to the third lateral surface 222*s*3. For example, the fourth lateral surface 222*s* of the second wall portion 222 protrudes beyond the third lateral surface 221*s*. In addition, the first lateral surface 221*s*1 of the first wall portion 221 and the second lateral surface 222*s*2 of the second wall portion 222 are flushed with each other.

Figure 3A:
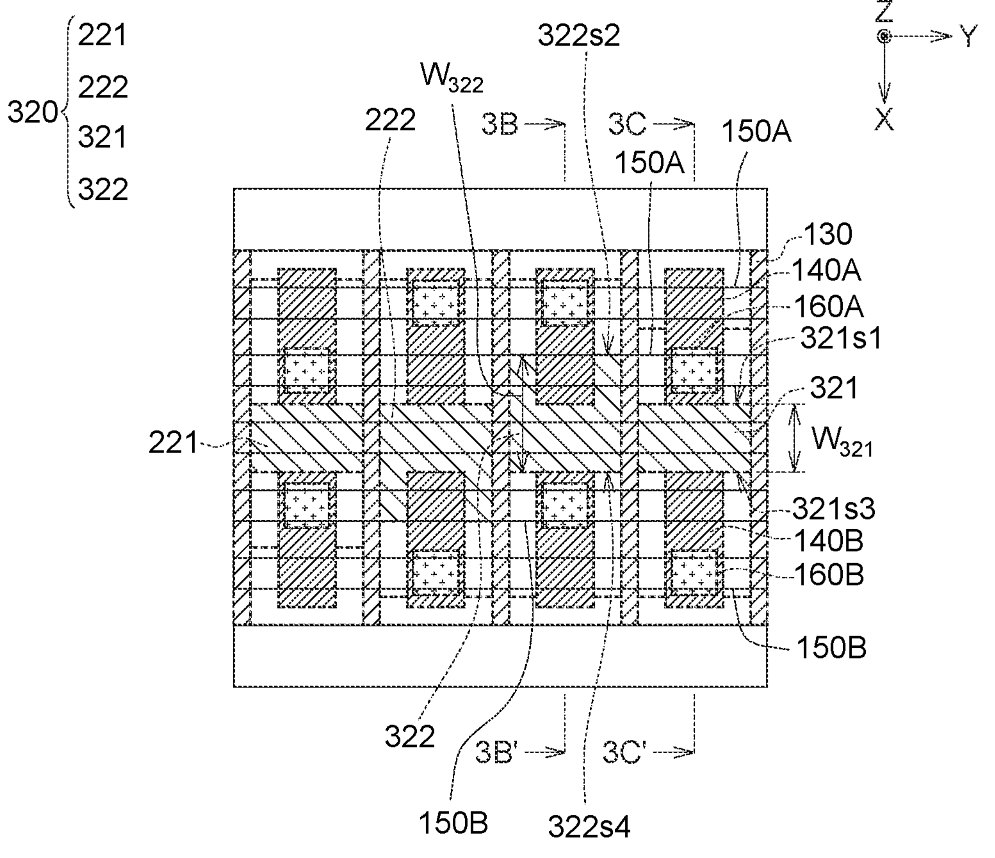
FIG. 3A illustrates a schematic diagram of a semiconductor structure according to an embodiment of the present disclosure.
Figures 3B, 3C:
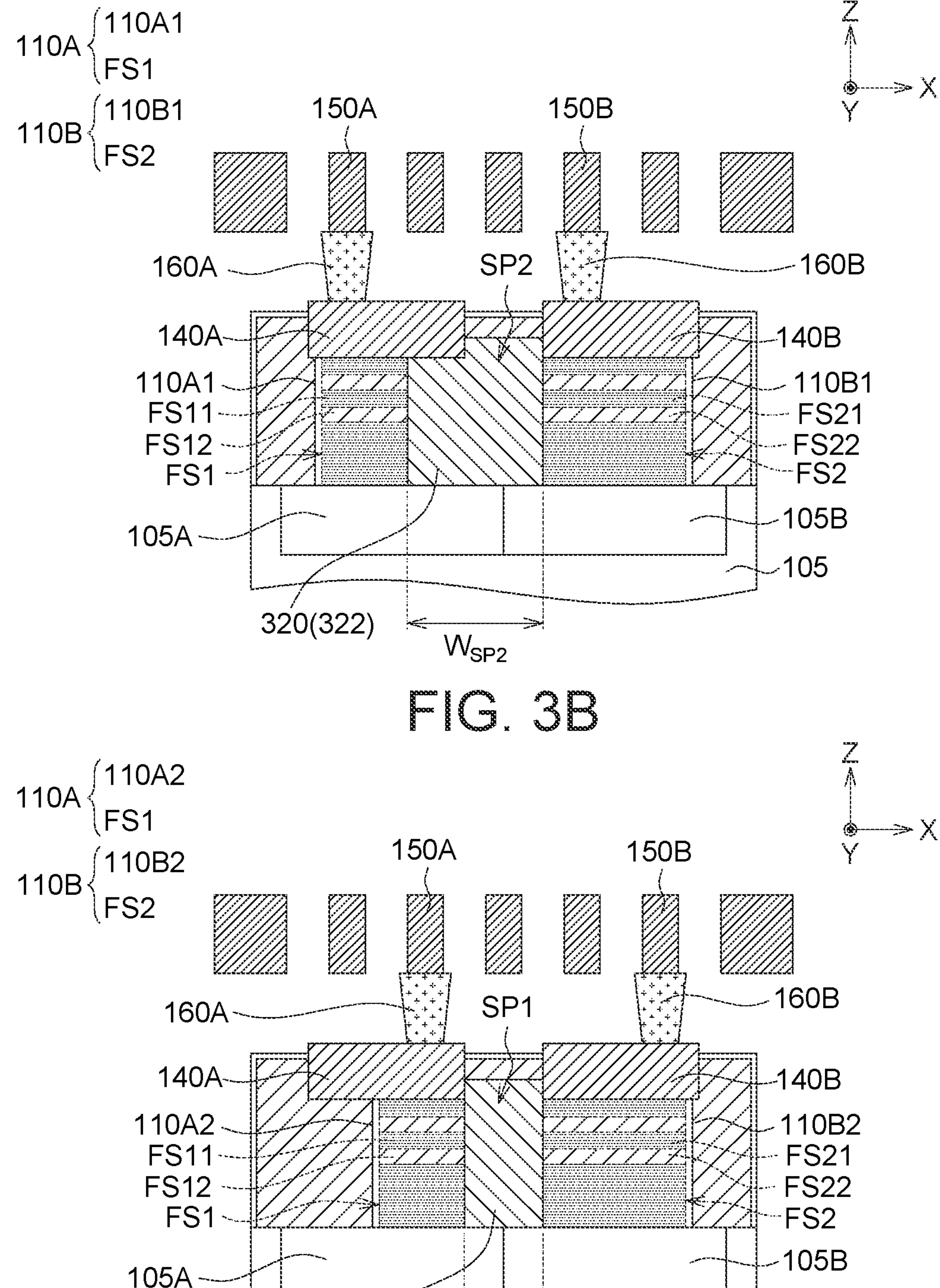
FIG. 3B illustrates cross-sectional view of the semiconductor structure in FIG. 3A along a direction 3B-3B'.
FIG. 3C illustrates cross-sectional view of the semiconductor structure in FIG. 3A along a direction 3C-3C'.

Referring to FIGS. 3A to 3C, FIG. 3A illustrates a schematic diagram of a semiconductor structure 300 according to an embodiment of the present disclosure, FIG. 3B illustrates cross-sectional view of the semiconductor structure 300 in FIG. 3A along a direction 3B-3B', and FIG. 3C illustrates cross-sectional view of the semiconductor structure 300 in FIG. 3A along a direction 3C-3C'.

The semiconductor structure 300 includes, for example, at least one Gate-all-around (GAA) structure, at least one fork-sheet structure, etc.

As illustrated in FIGS. 3A to 3C, the semiconductor structure 300 includes the substrate 105, a plurality of active regions (includes at least one first active region 110A and at least one second active region 110B), at least one dielectric wall 320, at least one metal gate 130 a conductive contact layer (includes at least one first conductive contact 140A and at least one second conductive contact 140B), a conductive line layer (includes at least one first conductive line 150A and at least one second conductive line 150B) and a conductive via layer (includes at least one first conductive via 160A and at least one second conductive via 160B).

The semiconductor structure 300 includes the features the same as or similar to that of the semiconductor structure 100, and difference is that the dielectric wall 320 and the dielectric wall 120 are different in structure.

As illustrated in FIGS. 3A to 3C, the dielectric wall 320 includes the first wall portion 221 having the first wall width $W_{121}$, the second wall portion 222 having the second wall width $W_{122}$, a first wall portion 321 having the first wall width W321 and a second wall portion 322 having the second wall width W322. In an embodiment, adjacent two of the first wall portion 221, the second wall portion 222, the first wall portion 321 and the second wall portion 322 is connected or dis connected. The first wall portion 321 has a first lateral surface 321*s*1 and a third lateral surface 321*s*3 opposite to the first lateral surface 321*s*1, the second wall portion 322 has a second lateral surface 322*s*2 and a fourth lateral surface 322*s*4 opposite to the second lateral surface 322*s*2. In the present embodiment, the second lateral surface 322*s*2 protrudes relative to the first lateral surface 321*s*1, and the fourth lateral surface 322*s*4 and the third lateral surface 322*s*3 are flushed with each other. In another embodiment, the second lateral surface 322*s*2 and the first lateral surface 321*s*1 are flushed with each other, and the fourth lateral surface 322*s*4 protrudes relative to the third lateral surface 322*s*3.

Figure 4A:
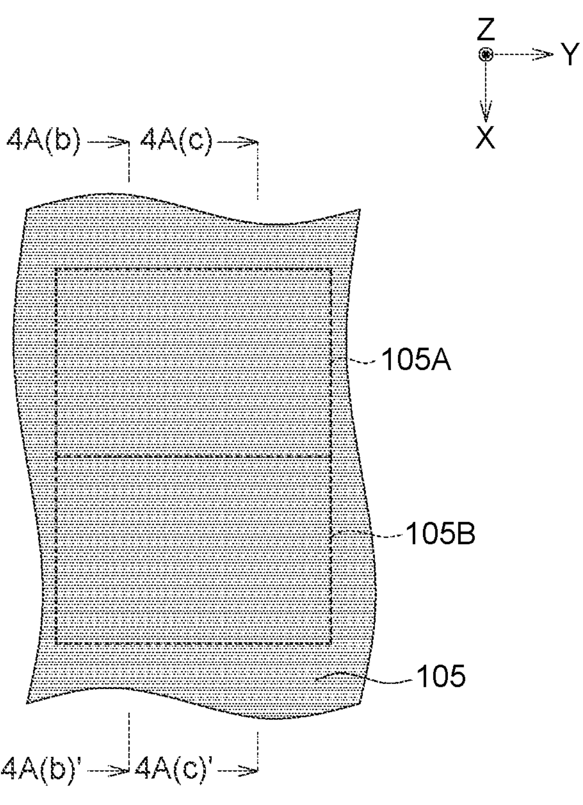
FIG. 4A(a) illustrates a schematic diagram of a plurality of sheet layers and a plurality of spacer layers being formed over the substrate.
Figure 4A:
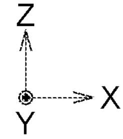
Figure 4A:
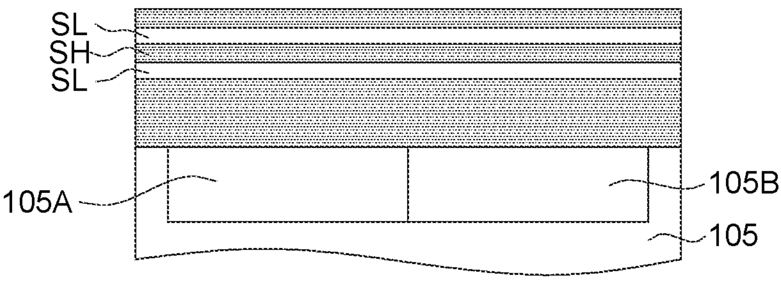
Figure 4A:
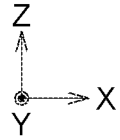
Figure 4A:
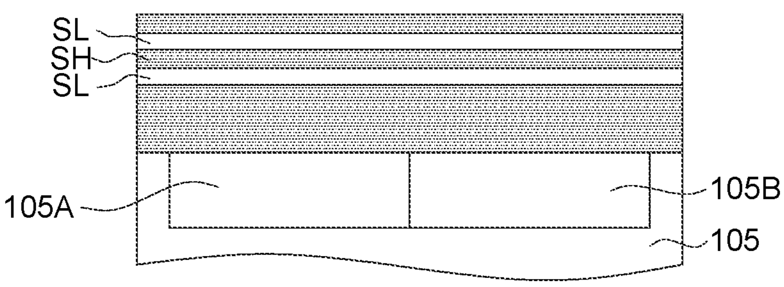
Figure 4B:
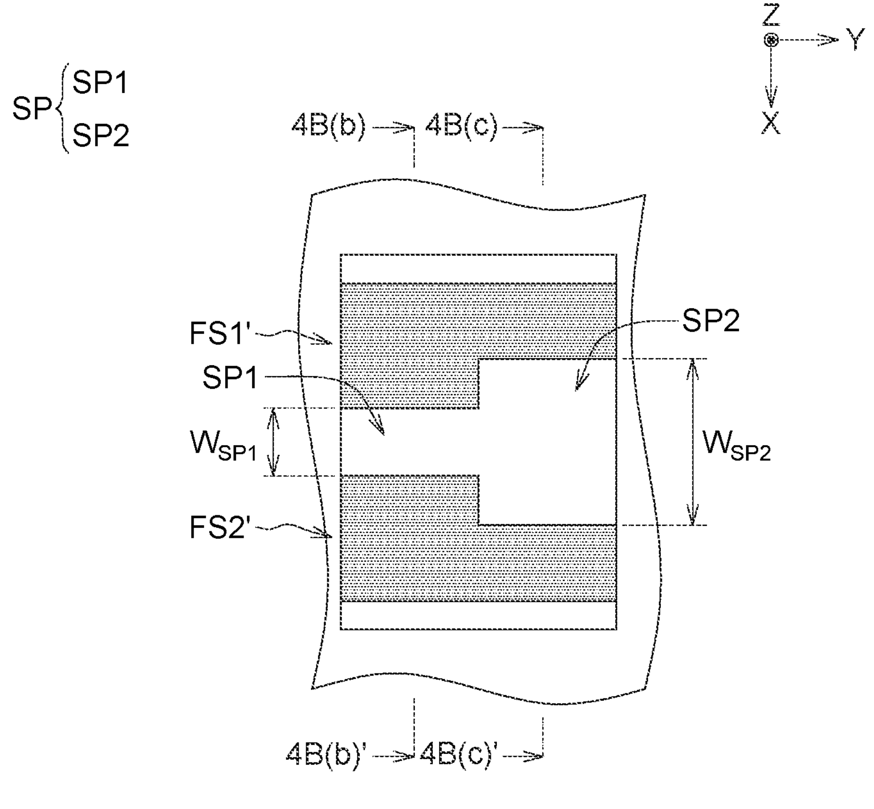
FIG. 4B(a) illustrates a schematic diagram of forming the space on the stacked structure in FIG. 4A(a)
Figure 4B:
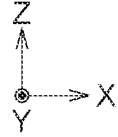
Figure 4B:
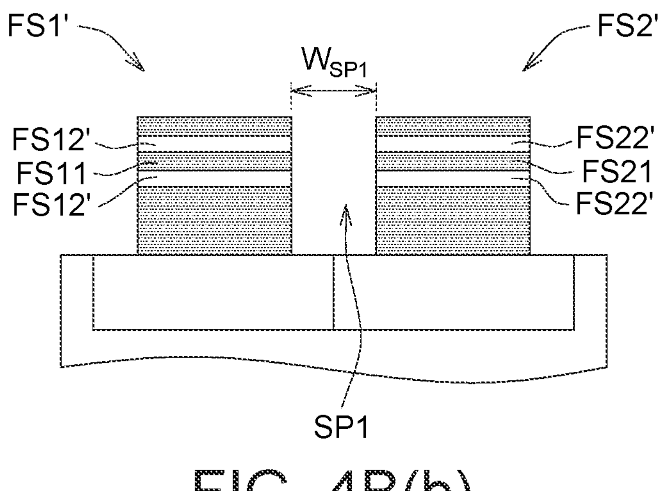
Figure 4B:
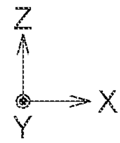
Figure 4B:
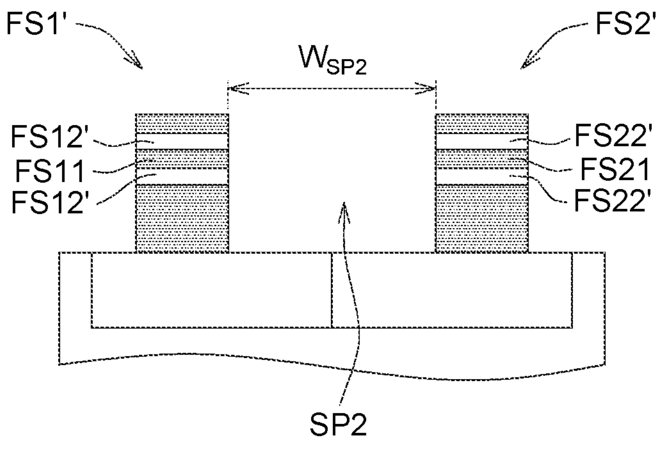
Figure 4C:
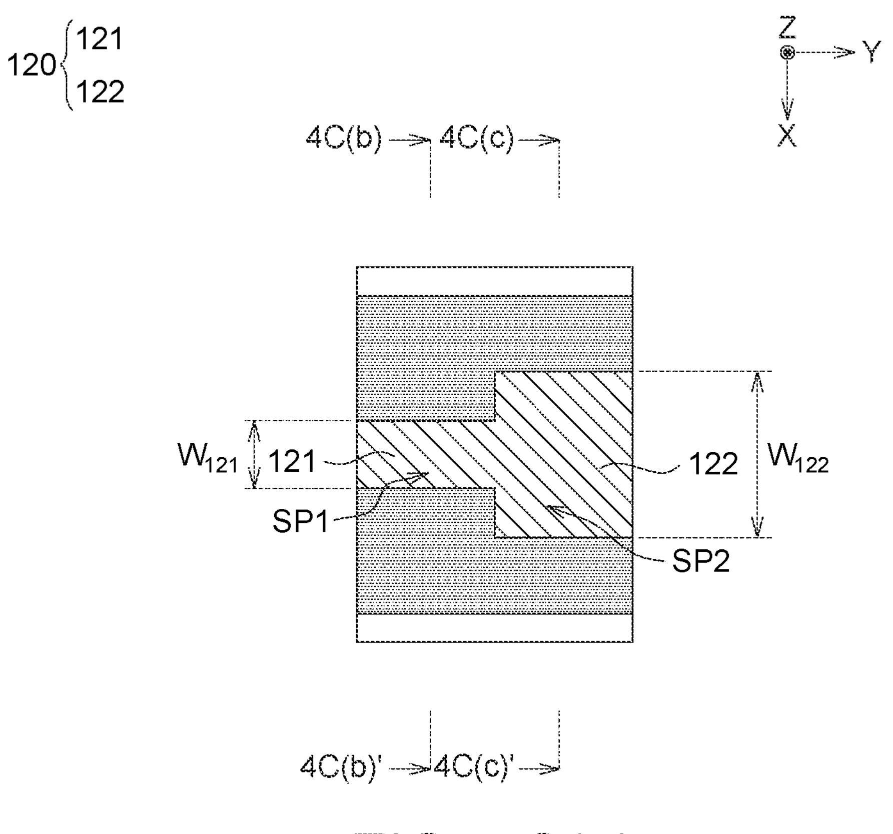
FIG. 4C(a) illustrates a schematic diagram of forming the dielectric wall material within the space in FIG. 4B(a)
Figure 4C:
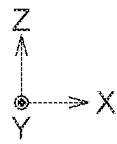
Figure 4C:
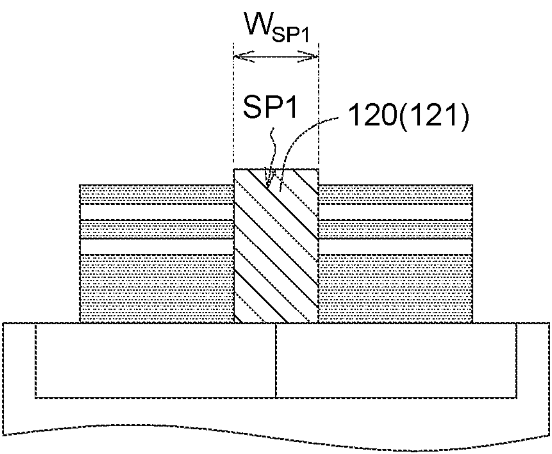
Figure 4C:
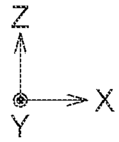
Figure 4C:
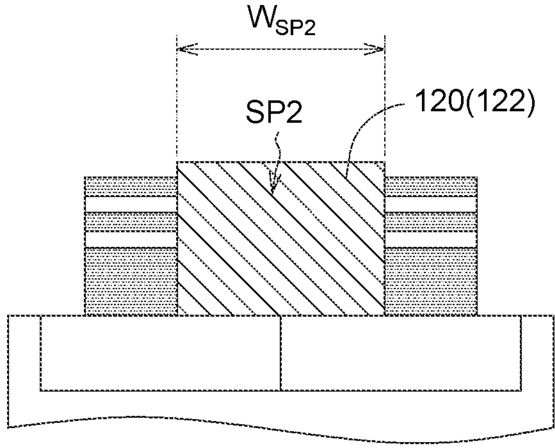
Figure 4D:
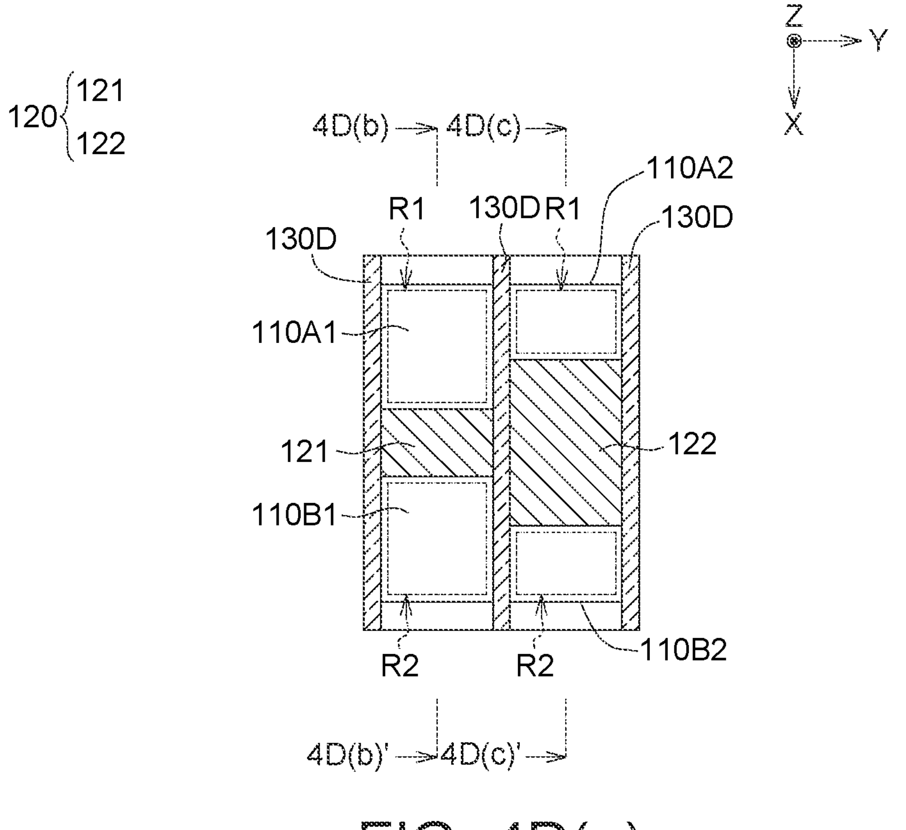
FIG. 4D(a) illustrates a schematic diagram of forming the dummy gates and the epitaxies on the structure in FIG. 4C(a)
Figure 4D:
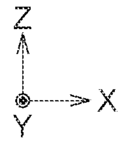
Figure 4D:
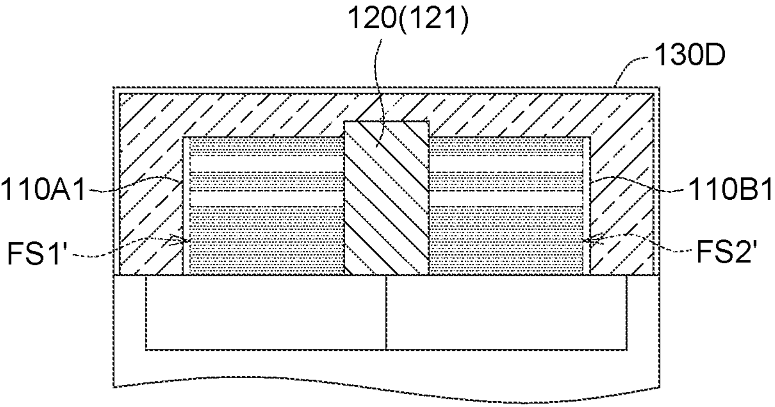
Figure 4D:
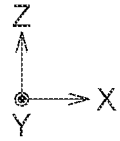
Figure 4D:
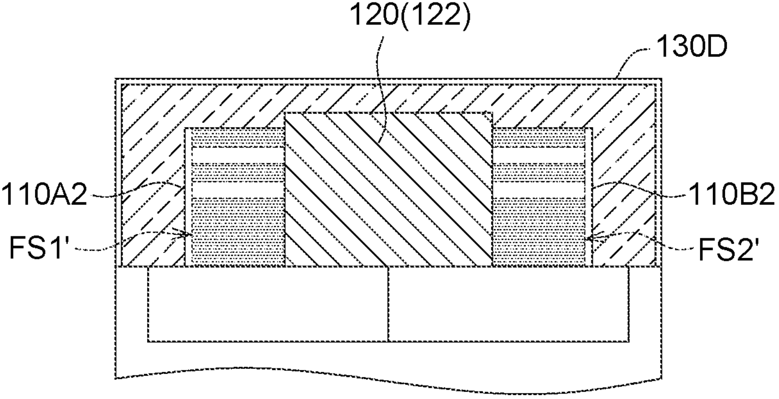
Figure 4E:
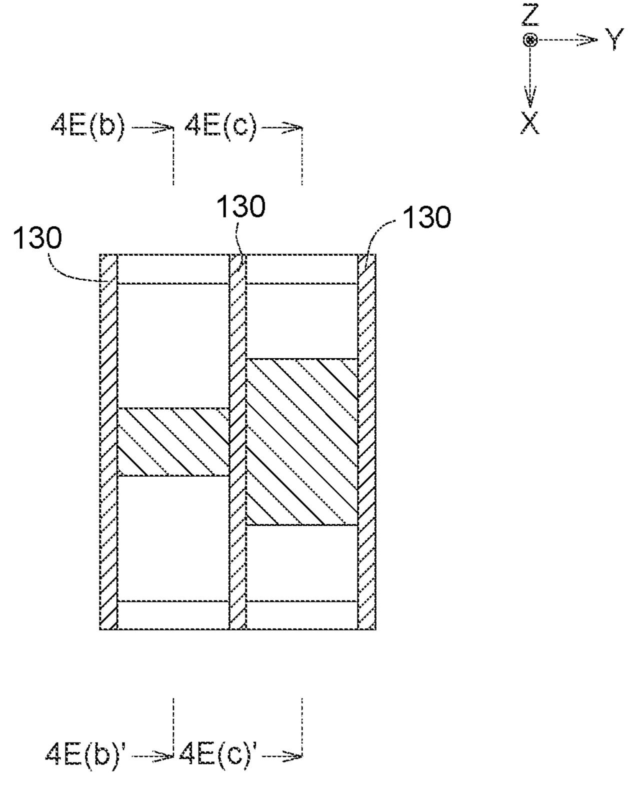
FIG. 4E(a) illustrates a schematic diagram of forming the metal gate on the fin structure in FIG. 4D(a)
Figure 4E:
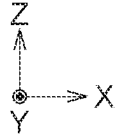
Figure 4E:
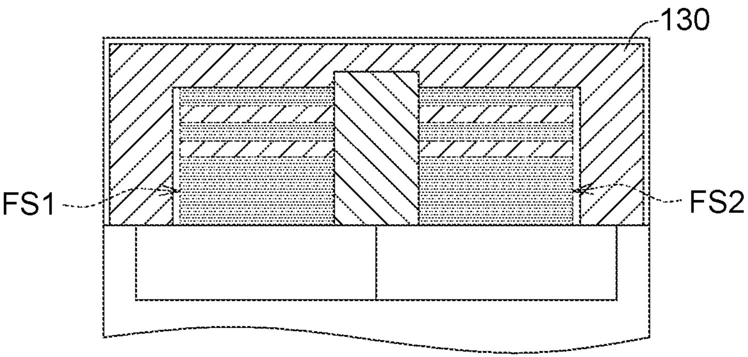
Figure 4E:
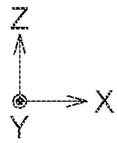
Figure 4E:
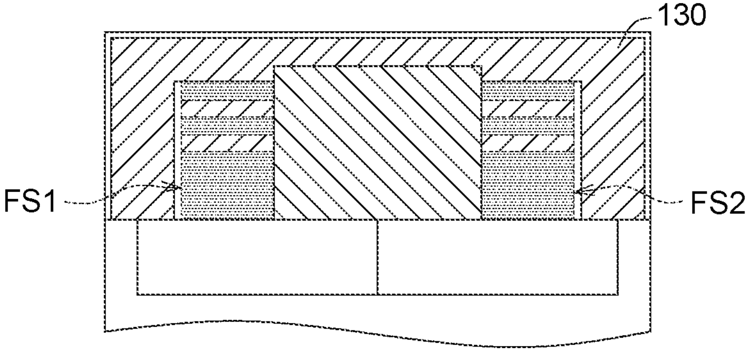
Figure 4F:
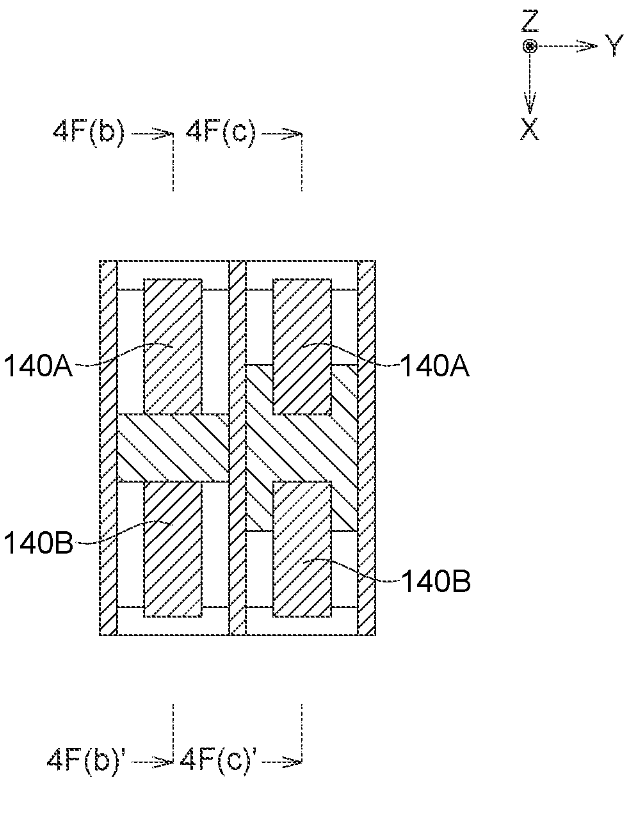
FIG. 4F(a) illustrates a schematic diagram of forming the conductive contact on the epitaxy in FIG. 4E(a)
Figure 4F:
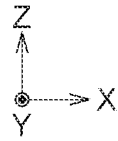
Figure 4F:
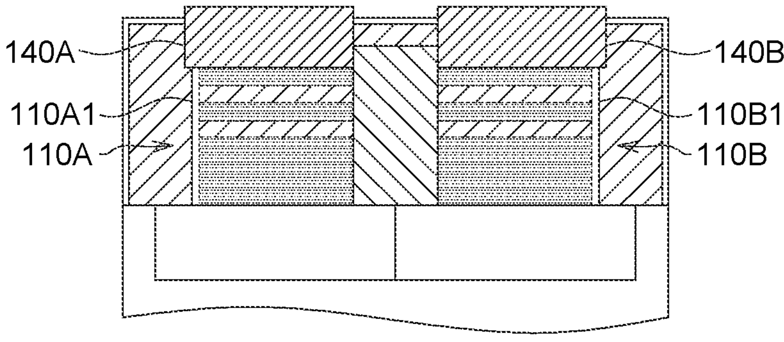
Figure 4F:
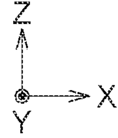
Figure 4F:
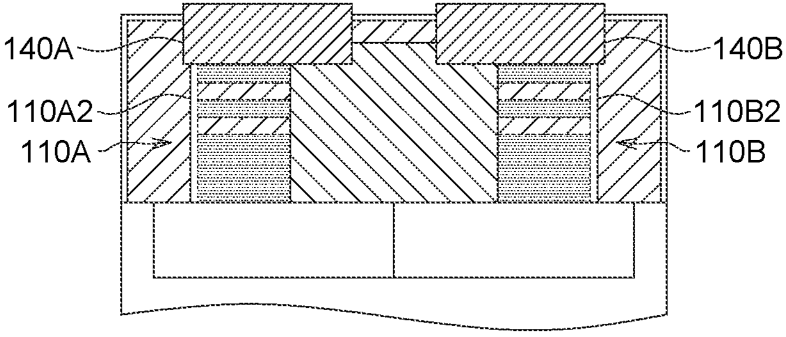
Figure 4G:
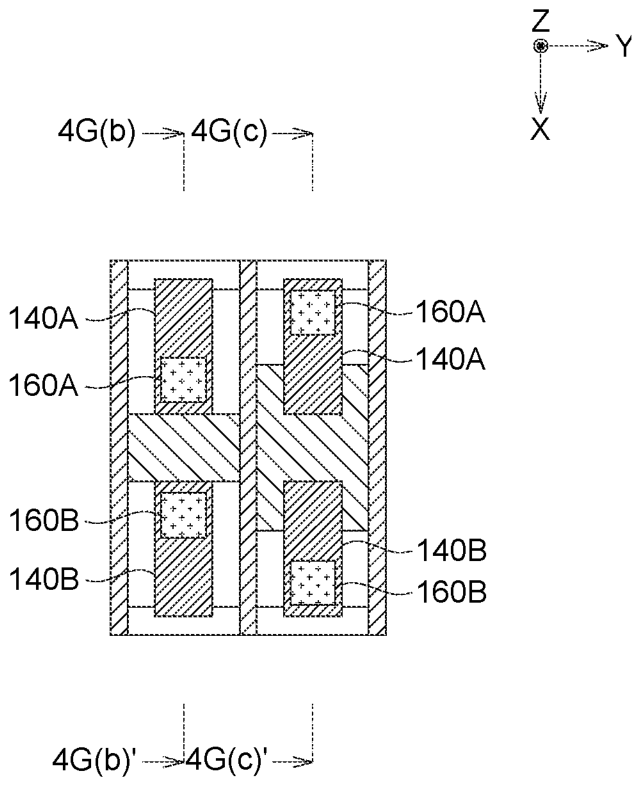
FIG. 4G(a) illustrates a schematic diagram of forming the conductive via on the conductive contact in FIG. 4F(a)
Figure 4G:
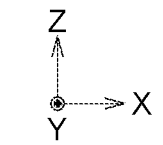
Figure 4G:
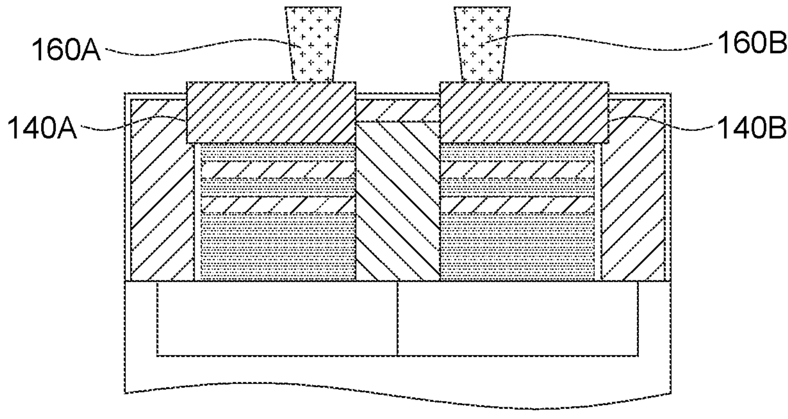
Figure 4G:
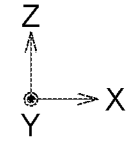
Figure 4G:
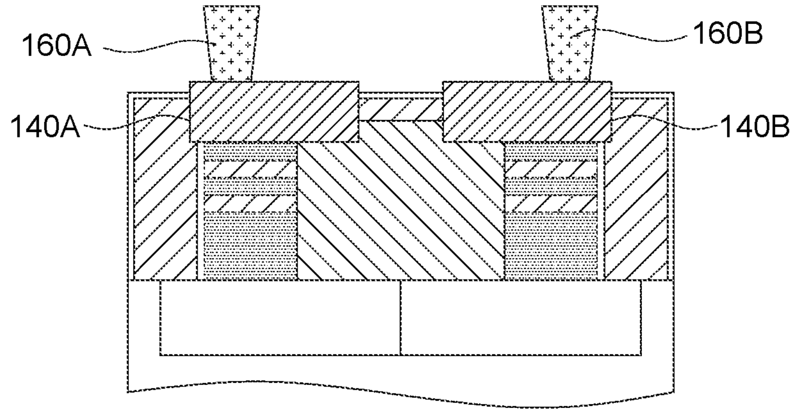

Referring to FIGS. 4A(a) to 4G(c), FIGS. FIGS. 4A(a) to 4G(c) illustrate schematic diagrams of manufacturing processes of the semiconductor structure 100 in FIG. 1A, wherein FIG. 4A(a) illustrates a schematic diagram of a plurality of sheet layers SH and a plurality of spacer layers SL being formed over the substrate 105, FIG. 4A(b) illustrates a cross-sectional view of the structure in FIG. 4A(a) along a direction 4A(b)-4A(b)', FIG. 4A(c) illustrates a cross-sectional view of the structure in FIG. 4A(a) along a direction 4A(c)-4A(c)', FIG. 4B(a) illustrates a schematic diagram of forming the space SP on the stacked structure in FIG. 4A(a), FIG. 4B(b) illustrates a cross-sectional view of the structure in FIG. 4B(a) along a direction 4B(b)-4B(b)', FIG. 4B(c) illustrates a cross-sectional view of the structure in FIG. 4B(a) along a direction 4B(c)-4B(c)', FIG. 4C(a) illustrates a schematic diagram of forming the dielectric wall material 120 within the space SP in FIG. 4B(a), FIG. 4C(b) illustrates cross-sectional view of the structure in FIG. 4C(a) along a direction 4C(b)-4C(b)', FIG. 4C(c) illustrates cross-sectional view of the structure in FIG. 4C(a) along a direction 4C(c)-4C(c)', FIG. 4D(a) illustrates a schematic diagram of forming the dummy gates 130D and the epitaxies on the structure in FIG. 4C(a), FIG. 4D(b) illustrates cross-sectional view of the structure in FIG. 4D(a) along a direction 4D(b)-4D(b)', FIG. 4D(c) illustrates cross-sectional view of the structure in FIG. 4D(a) along a direction 4D(c)-4D(c)', FIG. 4E(a) illustrates a schematic diagram of forming the metal gate 130 on the fin structure in FIG. 4D(a), FIG. 4E(b) illustrates cross-sectional view of the structure in FIG. 4E(a) along a direction 4E(b)-4E(b)', FIG. 4E(c) illustrates cross-sectional view of the structure in FIG. 4E(a) along a direction 4E(c)-4E(c)', FIG. 4F(a) illustrates a schematic diagram of forming the conductive contact on the epitaxy in FIG. 4E(a), FIG. 4F(b) illustrates cross-sectional view of the structure in FIG. 4F(a) along a direction 4F(b)-4F(b)', FIG. 4F(c) illustrates cross-sectional view of the structure in FIG. 4F(a) along a direction 4F(c)-4F(c)', FIG. 4G(a) illustrates a schematic diagram of forming the conductive via on the conductive contact in FIG. 4F(a), FIG. 4G(b) illustrates cross-sectional view of the structure in FIG. 4G(a) along a direction 4G(b)-4G(b)', and FIG. 4G(c) illustrates cross-sectional view of the structure in FIG. 4G(a) along a direction 4G(c)-4G(c)'.

As illustrated in FIGS. 4A(a) to 4A(c), the substrate 105 is provided, wherein the first-type doped region 105A and the second-type doped region 105B are doped in the substrate 105. A plurality of sheet layers SH and a plurality of spacer layers SL over the substrate 105 are formed, wherein the adjacent two sheet layers SH are spaced by one spacer layers SL, or the adjacent two spacer layers SL are spaced by one sheet layers SH. The substrate 105 may be formed of a material including, for example, silicon. The sheet layers SH may be the semiconductor material to be used for the channels of the semiconductor structure 100, and the spacer layer SL may be a sacrificial layer which will be removed in subsequent process. The sheet layers SH may be formed of a material including, for example, silicon, and the spacer layer SL may be formed of a material including, for example, silicon germanium.

As illustrated in FIGS. 4B(a) to 4B(c), a portion of each sheet layer SH and a portion of each spacer layers SL are removed to form at least one space SP through a patterned hard mask (not illustrated) by using, for example, lithography process (exposure, etching and/or development). A remaining portion (for example, the spacers FS12' and FS22') of each spacer layer SL and a remaining portion (for example, the sheets FS11 and FS21) of each sheet layers SH form a plurality of fin structures, for example, at least one first fin structure FS1' and at least one second fin structure FS2' extending in Y axis. The region of one fin structure defines one active region (or one OD region), for example.

In FIGS. 4B(a) to 4B(c), each first fin structure FS1' includes a plurality of first sheets FS11 and a plurality of first spacers FS12', wherein one of the first sheets FS11 is formed between adjacent two of the first spacers FS12'. Each second fin structure FS2' includes a plurality of second sheets FS21 and a plurality of second spacers FS22', wherein one of the second sheets FS21 is formed between adjacent two of the second spacers FS22'. The space SP between the first fin structure FS1' and the second fin structure FS2'. The space SP includes the first sub-space SP1 and the sub-second space SP2, the first sub-space SP1 has the first space width $W_{SP1}$, and the second sub-space SP2 has the second space width $W_{SP2}$ different from the first space width $W_{SP1}$. In the present embodiment, the second space width $W_{SP2}$ is greater than the first space width $W_{SP1}$. In another embodiment, the second space width $W_{SP2}$ may be smaller than the first space width W1.

As illustrated in FIGS. 4C(a) to 4C(c), the dielectric wall 120 filling at least one portion of the space SP is formed by using, for example, deposition.

In an embodiment, the dielectric wall 120 is multi-layered structure or a single-layered structure. For the multi-layered structure, although not illustrated, the dielectric wall 120 may include a shell layer and a core layer, wherein the shell layer is formed on sidewalls of the fin structure, and the core layer formed on sidewalls of the shell layer. For the single-layered structure, the dielectric wall 120 is one of the shell layer and the core layer. In addition, the shell layer may be formed of a material including, for example, SiOC and/or SiOCN, while the core layer may be formed of a material including, for example, SiN and/or SiCN. In another embodiment, the shell layer may be formed of a material including, for example, SiN and/or SiCN, while the core layer may be formed of a material including, for example, SiOC and/or SiOCN. In addition, the shell layer has a thickness ranging, for example, between 2 nm to 6 nm.

In FIGS. 4C(a) to 4C(c), the dielectric wall 120 includes the first wall portion 121 having the first wall width $W_{121}$ and the second wall portion 122 having the second wall width $W_{122}$, wherein the first wall portion 121 may be connected with the first wall portion 121 or disconnected from the first wall portion 121. The second wall width $W_{122}$ is different from the first wall width $W_{121}$. As a result, through different width design, the configuration flexibility and/or the design flexibility of the active region could be increased, and accordingly it could improve the electrical connection between the active region and the conductive via. In an embodiment, the first wall width $W_{121}$ may ranges 1 nm and 50 nm, even greater or less, and the second wall width $W_{122}$ may ranges 2 nm and 100 nm, even greater or less. In another embodiment, a ratio of the second wall width $W_{122}$ to the first wall width $W_{121}$ may range 1.1 and 2, even greater or less.

As illustrated in FIG. 4D(a) to 4D(c), at least one dummy gate 130D is formed over the fin structure in X axis. Then, a portion of fin structure is removed to form at least one first recess R1 and at least one second recess R2 through the dummy gate 130D by etching back, lithography process, etc. A remaining portion of the first sheets FS11 and a remaining portion of the first spacers FS12' which are covered by the dummy gate 130D are exposed from the first recess R1, and the second sheets FS21 and the first spacers FS12' which are covered by the dummy gate 130D are exposed from the second recess R2. Then, the first epitaxy 110A1 and the second epitaxy 110A2 are formed within the first recess R1 by using epitaxy process, and the third epitaxy 110B1 and the fourth second epitaxy 110B2 are formed within the second recess R2 by using epitaxy process. After the first epitaxy 110A1, the third epitaxy 110B1, the third epitaxy 110B1 and the fourth second epitaxy 110B2 are formed, the first epitaxy 110A1, the second epitaxy 110A2 and the first structure FS1' form the first active region 110A, and the third epitaxy 110B1, the fourth second epitaxy 110B and the second structure FS2' form the second active region 110B.

As illustrated in FIG. 4E(a) to 4E(c), the dummy gates 130D are removed and then at least one metal gate 130 on the fin structure along X axis is formed.

As illustrated in FIG. 4F(a) to 4F(c), at least one first conductive contact 140A and at least one second conductive contact 140B are formed, wherein the first conductive contact 140A is formed over the first active region 110A, and the second conductive contact 140B is formed over the second active region 110B. Furthermore, the first conductive contact 140A is connected with the first epitaxy 110A1 of the first active region 110A, and another first conductive contact 140A is connected with the second epitaxy 110A2 of the first active region 110A. The second conductive contact 140B is connected with the third epitaxy 110B1 of the second active region 110B, and another second conductive contact 140B is connected with the fourth epitaxy 110B2 of the second active region 110B.

As illustrated in FIG. 4G(a) to 4G(c), at least one first conductive via 160A and at least one second conductive via 160B are formed, wherein the first conductive via 160A is connected with the first conductive contact 140A, and the second conductive via 160B is connected with the second conductive contact 140B.

Then, at least one first conductive line 150A and at least one second conductive line 150B in FIG. 1B are formed to form the semiconductor structure 100 in FIG. 1A.

The manufacturing method of the semiconductor structure 200 and the manufacturing method of the semiconductor structure 300 includes the processes the same as or similar to that of the semiconductor structure 100, and it will not repeated here.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a semiconductor structure includes a first active region, a second active region disposed adjacent to the first active region, and a dielectric wall formed within the space between the first active region and the second active region. The dielectric wall has a first wall width and a second wall width different from the first wall width. Accordingly, through different width design, the configuration flexibility and/or the design flexibility of the active region could be increased, and accordingly it could improve the electrical connection between the active region and the conductive via.

Example embodiment 1: a semiconductor structure includes a first active region, a second active region, a metal gate and a dielectric wall. The first active region includes a plurality of first active channel layers vertically stacked. The second active region is disposed adjacent to the first active region and includes a plurality of second active channel layers vertically stacked, wherein the sheets and the spacers are stacked to each other, wherein there is a space between the first active region and the second active region. The metal gate is formed on the first active region and the second active region. The dielectric wall is formed within the space between the first active region and the second active region. The dielectric wall has a first wall width and a second wall width different from the first wall width.

Example embodiment 2 based on Example embodiment 1: the dielectric wall extends in a first direction, the first active region includes one of a source epitaxy and a drain epitaxy, the second active region includes another of the source epitaxy and the drain epitaxy, and the metal gate extends in a second direction perpendicular to the first direction. The source epitaxy, the drain epitaxy and the metal gate form a transistor.

Example embodiment 3 based on Example embodiment 1: the dielectric wall extends in a first direction, the first active region includes a first epitaxy and a second epitaxy, the first epitaxy is corresponding to the first wall width in a second direction perpendicular to the first direction, and the second epitaxy is corresponding to the second wall width in the second direction.

Example embodiment 4 based on Example embodiment 1: the second active region includes a third epitaxy and a fourth epitaxy, the third epitaxy is corresponding to the first wall width in the second direction, and the fourth epitaxy is corresponding to the second wall width in the second direction.

Example embodiment 5 based on Example embodiment 1: the space includes a first sub-space and a second sub-space, the first sub-space has a first space width, the second sub-space has a second space width different from the first space width.

Example embodiment 6 based on Example embodiment 5: the first sub-space and the second sub-space are located at opposite two sides of a metal gate.

Example embodiment 7 based on Example embodiment 1: the dielectric wall includes a first wall portion having the first wall width and a second wall portion having the second wall width, the first wall portion has a first lateral surface and a third lateral surface opposite to the first lateral surface, the second wall portion has a second lateral surface and a fourth lateral surface opposite to the second lateral surface, the fourth lateral surface protrudes relative to the third lateral surface, and the first lateral surface and the second lateral surface are flushed with each other.

Example embodiment 8 based on Example embodiment 1: the dielectric wall includes a first wall portion having the first wall width and a second wall portion having the second wall width, the first wall portion has a first lateral surface and a third lateral surface opposite to the first lateral surface, the second wall portion has a second lateral surface and a fourth lateral surface opposite to the second lateral surface, the second lateral surface protrudes relative to the first lateral surface, and the fourth lateral surface protrudes relative to the third lateral surface.

Example embodiment 9 based on Example embodiment 1: the first active region includes an epitaxy; the semiconductor structure further includes a conductive contact formed on the epitaxy, and a conductive via formed on the conductive contact. The conductive via overlaps the epitaxy in a vertical direction.

Example embodiment 10 based on Example embodiment 1: the semiconductor structure further includes a conductive contact formed on the first active region. The conductive contact is formed over a portion of the dielectric wall.

Example embodiment 11: a semiconductor structure includes a first active region, a second active region and a dielectric wall. The first active region includes a plurality of first active channel layers vertically stacked. The second active region is disposed adjacent to the first active region and includes a plurality of second active channel layers vertically stacked, wherein there is a space between the first active region and the second active region. The dielectric wall is formed within the space between the first active region and the second active region, and includes a first wall portion and a second wall portion, wherein the first wall portion has a first lateral surface, the second wall portion protrudes with respect to the first lateral surface of the first wall portion.

Example embodiment 12 based on Example embodiment 11: the second wall portion has a second lateral surface protruding beyond the first lateral surfaces of the first wall portion, and the first wall portion further has a third lateral surface opposite to the first lateral surface, the second wall portion protrudes with respect to the third lateral surface of the first wall portion.

Example embodiment 13 based on Example embodiment 11: the second wall portion has a second lateral surface, and the first lateral surface and the second lateral surface are flushed with each other.

Example embodiment 14 based on Example embodiment 11: the dielectric wall extends in a first direction, the first active region includes one of a source epitaxy and a drain epitaxy, the second active region includes another of the source epitaxy and the drain epitaxy, and the semiconductor structure further includes a metal gate extending in a second direction perpendicular to the first direction. The source epitaxy, the drain epitaxy and the metal gate form a transistor.

Example embodiment 15 based on Example embodiment 11: the dielectric wall extends in a first direction, the first active region includes a first epitaxy and a second epitaxy, the first epitaxy is corresponding to the first wall portion in a second direction perpendicular to the first direction, and the second epitaxy is corresponding to the second wall portion in the second direction.

Example embodiment 16 based on Example embodiment 11: the second active region includes a third epitaxy and a fourth epitaxy, the third epitaxy is corresponding to the first wall portion in the second direction, and the fourth epitaxy is corresponding to the second wall portion in the second direction.

Example embodiment 17 based on Example embodiment 11: the space includes a first sub-space and a second sub-space, the first sub-space has a first space width, the second sub-space has a second space width different from the first space width.

Example embodiment 18 based on Example embodiment 11: the first active region includes an epitaxy; the semiconductor structure further includes a conductive contact formed on the epitaxy, and a conductive via formed on the conductive contact. The conductive via overlaps the epitaxy in a vertical direction.

Example embodiment 19: a manufacturing method of a semiconductor structure includes the following steps: forming a first fin structure and a second fin structure adjacent to the first fin structure, wherein the first fin structure comprising a plurality of first sheets and a plurality of first spacers, the second fin structure comprising a plurality of second sheets and a plurality of second spacer, the first sheets and the first spacers are stacked to each other, the second sheets and the second spacers are stacked to each other, and there is a space between the first fin structure and the second fin structure; and forming a dielectric wall within the space between the first fin structure and the second fin structure, wherein the dielectric wall has a first wall width and a second wall width different from the first wall width.

Example embodiment 20 based on Example embodiment 19: the semiconductor method further includes: forming an epitaxy on the first fin structure; forming a conductive contact on the epitaxy; and forming a conductive via on the conductive contact, wherein the conductive via overlaps the epitaxy in a vertical direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first active region comprising a plurality of first active channel layers vertically stacked;

a second active region disposed adjacent to the first active region and comprising a plurality of second active channel layers vertically stacked, wherein there is a space between the first active region and the second active region;

a metal gate formed on the first active region and the second active region; and a dielectric wall formed within the space between the first active region and the second active region;

wherein the dielectric wall has a first wall width and a second wall width different from the first wall width;

wherein the first active region comprises an epitaxy; the semiconductor structure further comprises:

a conductive contact formed on the epitaxy; and a conductive via formed on the conductive contact;

wherein the conductive via overlaps the epitaxy in a vertical direction.

2. The semiconductor structure as claimed in claim 1, wherein the dielectric wall extends in a first direction, the epitaxy of the first active region is one of a source epitaxy and a drain epitaxy, the second active region comprises another of the source epitaxy and the drain epitaxy, and the metal gate extends in a second direction perpendicular to the first direction;

wherein the source epitaxy, the drain epitaxy and the metal gate form a transistor.

3. The semiconductor structure as claimed in claim 1, wherein the dielectric wall extends in a first direction, the first active region comprises a first epitaxy and a second epitaxy, the first epitaxy is corresponding to the first wall width in a second direction perpendicular to the first direction, and the second epitaxy is corresponding to the second wall width in the second direction.

4. The semiconductor structure as claimed in claim 3, wherein the second active region comprises a third epitaxy and a fourth epitaxy, the third epitaxy is corresponding to the first wall width in the second direction, and the fourth epitaxy is corresponding to the second wall width in the second direction.

5. The semiconductor structure as claimed in claim 1, wherein the space comprises a first sub-space and a second sub-space, the first sub-space has a first space width, the second sub-space has a second space width different from the first space width.

6. The semiconductor structure as claimed in claim 5, wherein the first sub-space and the second sub-space are located at opposite two sides of the metal gate.

7. The semiconductor structure as claimed in claim 1, wherein the dielectric wall comprises a first wall portion having the first wall width and a second wall portion having the second wall width, the first wall portion has a first lateral surface and a third lateral surface opposite to the first lateral surface, the second wall portion has a second lateral surface and a fourth lateral surface opposite to the second lateral surface, the fourth lateral surface protrudes relative to the third lateral surface, and the first lateral surface and the second lateral surface are flushed with each other.

8. The semiconductor structure as claimed in claim 1, wherein the dielectric wall comprises a first wall portion having the first wall width and a second wall portion having the second wall width, the first wall portion has a first lateral surface and a third lateral surface opposite to the first lateral surface, the second wall portion has a second lateral surface and a fourth lateral surface opposite to the second lateral surface, the second lateral surface protrudes relative to the first lateral surface, and the fourth lateral surface protrudes relative to the third lateral surface.

9. The semiconductor structure as claimed in claim 1, wherein the conductive contact is formed on the first active region, and the conductive contact is formed over a portion of the dielectric wall.

10. A semiconductor structure, comprising:

a first active region comprising a plurality of first active channel layers vertically stacked;

a second active region disposed adjacent to the first active region and comprising a plurality of second active channel layers vertically stacked, wherein there is a space between the first active region and the second active region; and a dielectric wall formed within the space between the first active region and the second active region, and comprising a first wall portion and a second wall portion, wherein the first wall portion has a first lateral surface, the second wall portion protrudes with respect to the first lateral surface of the first wall portion;

wherein the first active region comprises an epitaxy; the semiconductor structure further comprises:

a conductive contact formed on the epitaxy; and a conductive via formed on the conductive contact;

wherein the conductive via overlaps the epitaxy in a vertical direction.

11. The semiconductor structure as claimed in claim 10, wherein the second wall portion has a second lateral surface protruding beyond the first lateral surfaces of the first wall portion, and the first wall portion further has a third lateral surface opposite to the first lateral surface, the second wall portion protrudes with respect to the third lateral surface of the first wall portion.

12. The semiconductor structure as claimed in claim 10, wherein the second wall portion has a second lateral surface, and the first lateral surface and the second lateral surface are flushed with each other.

13. The semiconductor structure as claimed in claim 10, wherein the dielectric wall extends in a first direction, the epitaxy of the first active region is one of a source epitaxy and a drain epitaxy, the second active region comprises another of the source epitaxy and the drain epitaxy, and the semiconductor structure further comprises:

a metal gate extending in a second direction perpendicular to the first direction;

wherein the source epitaxy, the drain epitaxy and the metal gate form a transistor.

14. The semiconductor structure as claimed in claim 10, wherein the dielectric wall extends in a first direction, the first active region comprises a first epitaxy and a second epitaxy, the first epitaxy is corresponding to the first wall portion in a second direction perpendicular to the first direction, and the second epitaxy is corresponding to the second wall portion in the second direction.

15. The semiconductor structure as claimed in claim 14, wherein the second active region comprises a third epitaxy and a fourth epitaxy, the third epitaxy is corresponding to the first wall portion in the second direction, and the fourth epitaxy is corresponding to the second wall portion in the second direction.

16. The semiconductor structure as claimed in claim 10, wherein the space comprises a first sub-space and a second sub-space, the first sub-space has a first space width, the second sub-space has a second space width different from the first space width.

17. A manufacturing method of a semiconductor structure, comprising:

forming a first fin structure and a second fin structure adjacent to the first fin structure, wherein the first fin structure comprising a plurality of first sheets and a plurality of first spacers, the second fin structure comprising a plurality of second sheets and a plurality of second spacer, the first sheets and the first spacers are stacked to each other, the second sheets and the second spacers are stacked to each other, and there is a space between the first fin structure and the second fin structure; and forming a dielectric wall within the space between the first fin structure and the second fin structure, wherein the dielectric wall has a first wall width and a second wall width different from the first wall width;

wherein the semiconductor method further comprises:

forming an epitaxy on the first fin structure;

forming a conductive contact on the epitaxy; and forming a conductive via on the conductive contact, wherein the conductive via overlaps the epitaxy in a vertical direction.

18. The manufacturing method according to claim 17, wherein the space comprises a first sub-space and a second sub-space, the first sub-space has a first space width, the second sub-space has a second space width different from the first space width.

19. The manufacturing method according to claim 18, further comprising:

forming a metal gate on the first fin structure and the second fin structure;

wherein the first sub-space and the second sub-space are located at opposite two sides of the metal gate.

20. The manufacturing method according to claim 17, wherein in forming the dielectric wall within the space between the first fin structure and the second fin structure, the dielectric wall comprises a first wall portion having the first wall width and a second wall portion having the second wall width, the first wall portion has a first lateral surface and a third lateral surface opposite to the first lateral surface, the second wall portion has a second lateral surface and a fourth lateral surface opposite to the second lateral surface, the fourth lateral surface protrudes relative to the third lateral surface, and the first lateral surface and the second lateral surface are flushed with each other.

* * * * *